(12) United States Patent
Jung

(10) Patent No.: US 11,371,829 B2
(45) Date of Patent: Jun. 28, 2022

(54) WAFER CARRIER THICKNESS MEASURING DEVICE

(71) Applicant: SK SILTRON CO., LTD., Gumi-si (KR)

(72) Inventor: Suk Jin Jung, Gumi-si (KR)

(73) Assignee: SK SILTRON CO., LTD., Gumi-si (KR)

( * ) Notice: Subject to any disclaimer, the term of this patent is extended or adjusted under 35 U.S.C. 154(b) by 996 days.

(21) Appl. No.: 15/780,605

(22) PCT Filed: Jun. 5, 2017

(86) PCT No.: PCT/KR2017/005870
§ 371 (c)(1),
(2) Date: May 31, 2018

(87) PCT Pub. No.: WO2018/105831
PCT Pub. Date: Jun. 14, 2018

(65) Prior Publication Data
US 2021/0164769 A1 Jun. 3, 2021

(30) Foreign Application Priority Data
Dec. 6, 2016 (KR) .................. 10-2016-0165367

(51) Int. Cl.
*G01B 11/06* (2006.01)
*G01B 11/02* (2006.01)
(Continued)

(52) U.S. Cl.
CPC ........ *G01B 11/026* (2013.01); *G01B 9/02041* (2013.01); *G01B 9/02042* (2013.01);
(Continued)

(58) Field of Classification Search
CPC ............. G01B 11/026; G01B 11/0625; G01B 11/0633; G01B 11/06; G01B 11/14;
(Continued)

(56) References Cited

U.S. PATENT DOCUMENTS 6,153,444 A 11/2000 Nakano et al.
7,443,517 B2 10/2008 Sawabe et al.
(Continued)

FOREIGN PATENT DOCUMENTS

CN 101207058 A 6/2008
CN 101216686 A 7/2008
(Continued)

OTHER PUBLICATIONS

International Search Report of corresponding PCT/KR2017/005870, dated Oct. 26, 2017, 3 pages.
(Continued)

*Primary Examiner* — Jonathan M Hansen
(74) *Attorney, Agent, or Firm* — Lewis Roca Rothgerber Christie LLP

(57) ABSTRACT

The present invention relates to a wafer carrier thickness measuring device capable of accurately measuring an inner/outer circumferential thickness of a wafer carrier in a non-contact manner. The present invention provides a wafer carrier thickness measuring device including: a first table installed to be capable of rotating and moving vertically and capable of supporting a central portion of a wafer carrier; a second table disposed outside the first table and rotatably installed, and capable of supporting an outer circumferential portion of the wafer carrier; upper and lower sensors for calculating a thickness of the wafer carrier by measuring a distance to upper and lower surfaces of the wafer carrier supported by one of the first and second tables in a non-contact manner; and a sensor driving unit located at one side (Continued)

of the second table and moving the upper and lower sensors to an upper side or a lower side of the wafer carrier supported by one of the first and second tables.

14 Claims, 15 Drawing Sheets

(51) Int. Cl.
    *G01N 21/95*     (2006.01)
    *H01L 21/67*     (2006.01)
    *G01B 9/02*     (2022.01)

(52) U.S. Cl.
    CPC ...... *G01B 11/0625* (2013.01); *G01B 11/0633* (2013.01); *G01N 21/9501* (2013.01); *H01L 21/67253* (2013.01); *G01B 2210/50* (2013.01)

(58) Field of Classification Search
    CPC ............ G01B 9/02041; G01B 9/02042; G01B 2210/50; G01N 21/9501; H01L 21/67253; H01L 21/304; H01L 21/30625
    See application file for complete search history.

(56) References Cited

U.S. PATENT DOCUMENTS

| | | | |
|---|---|---|---|
| 9,396,983 | B2 | 7/2016 | Huang et al. |
| 2001/0029938 | A1 | 10/2001 | Arai et al. |
| 2008/0180697 | A1 | 7/2008 | Sawabe et al. |
| 2008/0233712 | A1* | 9/2008 | Sekiya .................... H01L 24/83 257/E21.599 |
| 2010/0025908 | A1 | 2/2010 | Munakata |
| 2010/0171823 | A1 | 7/2010 | Yamamoto et al. |
| 2012/0203473 | A1 | 8/2012 | Hayashi et al. |
| 2014/0107825 | A1* | 4/2014 | Kubodera ......... H01L 21/67259 700/112 |
| 2015/0348822 | A1 | 12/2015 | Huang et al. |
| 2016/0240370 | A1 | 8/2016 | Yamasaki et al. |
| 2018/0209033 | A1 | 7/2018 | Yamasaki et al. |
| 2019/0295879 | A1* | 9/2019 | Mashimo .......... H01L 21/68728 |

FOREIGN PATENT DOCUMENTS

| | | |
|---|---|---|
| CN | 201166564 Y | 12/2008 |
| CN | 101563769 A | 10/2009 |
| CN | 101777509 A | 7/2010 |
| CN | 201562672 U | 8/2010 |
| CN | 105161438 A | 12/2015 |
| CN | 105185722 A | 12/2015 |
| CN | 105280534 A | 1/2016 |
| CN | 105289923 A | 2/2016 |
| CN | 205102768 U | 3/2016 |
| CN | 105895559 A | 8/2016 |
| CN | 105990174 A | 10/2016 |
| CN | 106098621 A | 11/2016 |
| EP | 0827192 A2 | 3/1998 |
| JP | 6-49958 | 7/1994 |
| JP | 10-125753 | 5/1998 |
| JP | 2002323289 A | 11/2002 |
| JP | 2009262239 A | 11/2009 |
| KR | 10-0872755 | 12/2008 |
| KR | 10-1322591 | 10/2013 |
| KR | 10-1361382 | 2/2014 |

OTHER PUBLICATIONS

Chinese Office action for corresponding Chinese Application No. 201780004152.0, dated Dec. 4, 2019 (3 pages).

CNIPA Notification to Go through Formalities of Registration dated Nov. 25, 2020, issued in corresponding CN Application No. 201780004152.0, 8 pages.

\* cited by examiner

WAFER CARRIER THICKNESS MEASURING DEVICE

CROSS-REFERENCE TO RELATED APPLICATION(S)

This application is a National Phase Patent Application and claims priority to and the benefit of International Application Number PCT/KR2017/005870, filed on Jun. 5, 2017, which claims priority to Korean Patent Application Number 10-2016-0165367, filed on Dec. 6, 2016, the entire contents of all of which are incorporated herein by reference.

TECHNICAL FIELD

The present invention relates to a wafer carrier thickness measuring device capable of accurately measuring inner and outer circumferential thicknesses of a wafer carrier in a non-contact manner.

BACKGROUND ART

In general, a polishing process for mirroring a surface of a silicon wafer is performed in a process of manufacturing a silicon wafer, and such a polishing process controls nanotopography and roughness of a fine surface in parallel with mechanical and chemical reactions in order to improve a flatness of a wafer.

As described above, as a method for improving a flatness, a Double Side Polishing (DSP) process, which is superior to a single side polishing process in a flatness of a wafer is performed, and such a double-side polishing process usually polishes both sides of a wafer by using a double-side polishing apparatus.

In general, as a double-side polishing apparatus, a four-way type in which both sides of a wafer mounted on a carrier are polished by rotating four parts of an upper surface plate, a lower surface plate, a sun gear, and an internal gear is widely used.

However, a carrier on which a wafer is mounted undergoes a process of measuring the thickness thereof several times before and after being put into a polishing process.

First, a thickness of a carrier is measured at the time of an incoming of a carrier product, and by using carriers having thicknesses within a similar range, it is possible to reduce a process deviation of a wafer during a polishing process.

Further, after a seasoning process for removing fine foreign substances on a surface, a thickness of the carrier may be measured and then prepared as a wafer carrier to be actually processed.

Furthermore, as the wafer polishing process is repeated, a surface of the carrier is polished together with a surface of the wafer. Since the carrier is used in the polishing process at intervals of one to seven days, a thickness of the carrier is measured several times during the polishing process.

Of course, if a thickness measurement value of the carrier deviates by 5 um or more from an average level, it is determined that a function of the carrier may not be performed, and the existing carrier may be discarded, and then a new carrier should be inserted.

FIG. 1 is a view illustrating a typical wafer carrier, FIG. 2 is a view illustrating a wafer carrier thickness measuring device according to the related art, and FIG. 3 is a graph illustrating a result of a thickness measurement of a wafer carrier according to the related art.

A typical wafer carrier C is made of epoxy glass as shown in FIG. 1, and glass fiber F components are arranged in a lattice pattern on a surface in order to ensure strength.

In a conventional wafer thickness measuring device for measuring a thickness t of a wafer carrier, as shown in FIG. 2, a thickness measuring sensor 2 is installed so as to be movable vertically on a surface plate 1, and a tip 2A as a kind of contact sensor is provided on a lower side of the sensor 2.

First, when the sensor 2 is lowered without the carrier C on the surface plate 1, a lowering length of the sensor 2 is detected as a reference length $L_0$ at the time when the tip 2A comes into contact with the surface plate 1.

Next, when an operator places the carrier C on the surface plate 1 and lowers the sensor 2 in a state in which the carrier C is present on the surface plate 1, a lowering length of the sensor 2 is detected as a measured length $L_1$ at the time when the tip 2A comes into contact with the surface plate 1.

A thickness t of the carrier C may be calculated by calculating the reference length $L_0$ and the measured length $L_1$ measured as described above.

However, as shown in FIG. 3, a thickness t of the wafer carrier varies depending on a position, that is, a thickness t of the carrier is measured thicker at a point where glass fiber is present, while a thickness t of the carrier is measured thinner at a point where glass fiber is not present.

At this point, a length including 4 to 5 pieces of glass fiber may be set as a basic measuring length, and a thickness t of the wafer carrier may be calculated by averaging thickness measurement values of the carrier corresponding to the basic measuring length, and thus it is possible to reduce influence of a peak value and a valley value of the thickness measurement value.

However, according to the related art, since a tip comes down directly into contact with a surface plate or a wafer carrier, a wafer carrier thickness measuring device may damage a surface of the wafer carrier.

Further, according to the related art, since a lower surface of a wafer carrier is brought into contact with a surface plate, and measurement is performed on an upper surface of the wafer carrier, there is a fine gap between the wafer carrier and the surface plate, and thus a thickness of the wafer carrier may not be accurately measured.

Further, according to the related art, since an operator loads a wafer carrier on a surface plate, there is a problem that it is difficult to load a wafer carrier at the same position each time, and thus it is difficult to measure a thickness at the same position for each wafer carrier.

DISCLOSURE

Technical Problem

The present invention has been devised in order to solve the above-mentioned problems of the related art, and the present invention is directed to providing a wafer carrier thickness measuring device capable of accurately measuring inner and outer circumferential thicknesses of a wafer carrier in a non-contact manner.

Technical Solution

The present invention provides a wafer carrier thickness measuring device including: a first table installed to be capable of rotating and moving vertically and capable of supporting a central portion of a wafer carrier; a second table disposed outside the first table and rotatably installed, and capable of supporting an outer circumferential portion of the wafer carrier; upper and lower sensors for calculating a thickness of the wafer carrier by measuring a distance to upper and lower surfaces of the wafer carrier supported by one of the first and second tables in a non-contact manner; and a sensor driving unit located at one side of the second table and moving the upper and lower sensors to an upper side or a lower side of the wafer carrier supported by one of the first and second tables.

Further, in the present invention, the sensor driving unit includes a rotating shaft positioned in a vertical direction on one side of the second table, an upper fixing end extending in a horizontal direction from an upper portion of the rotating shaft and fixing an upper sensor, a lower fixing end extending in a horizontal direction from a lower portion of the rotating shaft and fixing a lower sensor, and a rotary motor rotating the rotating shaft.

Further, in the present invention, the wafer is provided with at least one or more alignment indication portions, and the wafer carrier thickness measuring device further includes an alignment sensor for detecting the alignment indication portion of the wafer placed on one of the first and second tables.

Advantageous Effects

According to the present invention, a wafer carrier thickness measuring device may selectively support inner and outer circumferential portions of a wafer carrier by first and second tables, and may calculate a thickness of the wafer carrier by measuring a distance to an upper and a lower surface of the wafer carrier simultaneously by first and second sensors in a non-contact manner.

Accordingly, it is possible to prevent the wafer carrier from being damaged at the time of measuring a thickness of the wafer carrier and to directly measure a distance to the upper and lower surfaces of the wafer carrier to calculate the thickness thereof, and thus the thickness of the wafer carrier can be accurately measured and measurement accuracy can be increased.

In the present invention, the wafer carrier thickness measuring device may detect an alignment indication portion provided on a wafer by an alignment sensor even though the wafer is loaded on one of the first and second tables and measure a thickness of the wafer according to a position of the wafer on the basis of the alignment indication portion of the wafer.

Accordingly, the wafer carrier may be loaded at the same position each time, and thus, a thickness may be measured at the same position for each wafer carrier, thereby increasing measurement reproducibility.

MODES OF THE INVENTION

Hereinafter, the present embodiment will be described in detail with reference to the accompanying drawings. However, the scope of the spirit of the present invention possessed by the embodiment may be determined from the matters disclosed in the embodiment, and the spirit of the present invention possessed by the embodiment includes practical modifications such as addition, deletion, alteration, and the like of components to the following proposed embodiment.

FIGS. 4 to 7 are views illustrating a wafer carrier thickness measuring device according to the present invention.

In the present invention, the wafer carrier thickness measuring device is configured to include first and second tables 110 and 120 capable of selectively supporting inner and outer circumferential portions of a wafer carrier as shown in FIGS. 4 to 7, upper and lower sensors 131 and 132 capable of calculating a thickness by measuring a distance to upper and lower surfaces of the wafer carrier in a non-contact manner, a sensor driving unit 140 for moving the upper and lower sensors 131 and 132 to an upper side or a lower side of the wafer carrier supported by the first and second tables 110 and 120, and a monitor M capable of monitoring a sensor measuring process of the wafer carrier and a controller (not shown).

Figure 1:
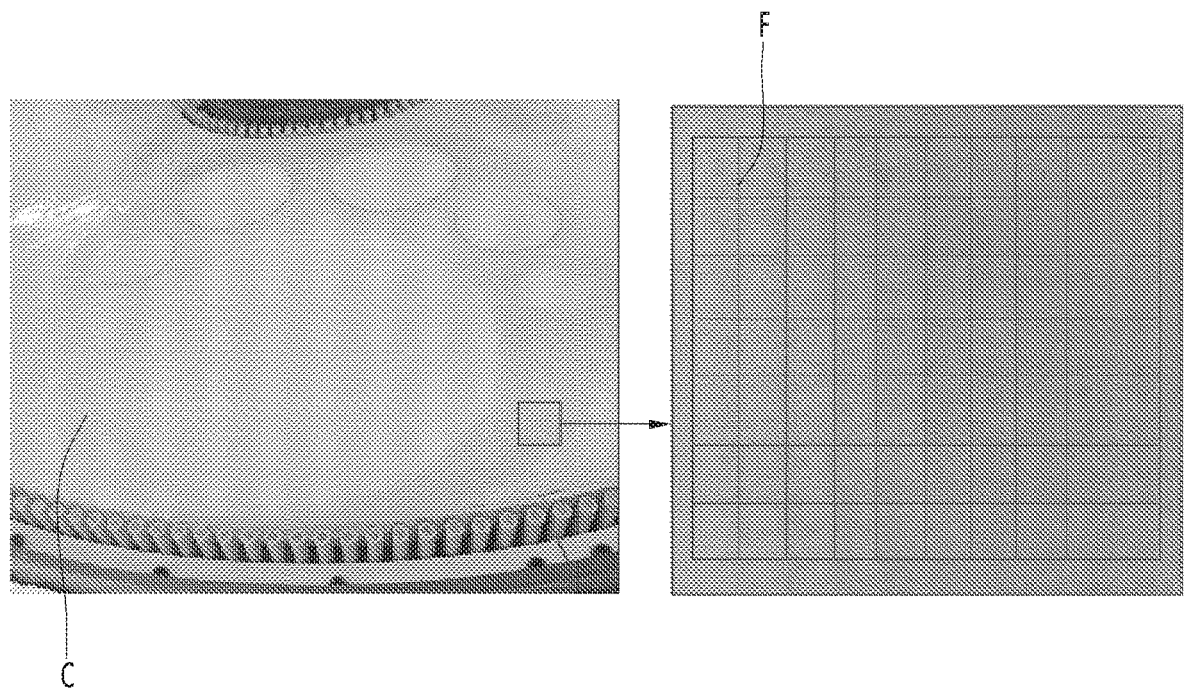
FIG. 1 is a view illustrating a typical wafer carrier.
Figure 2:
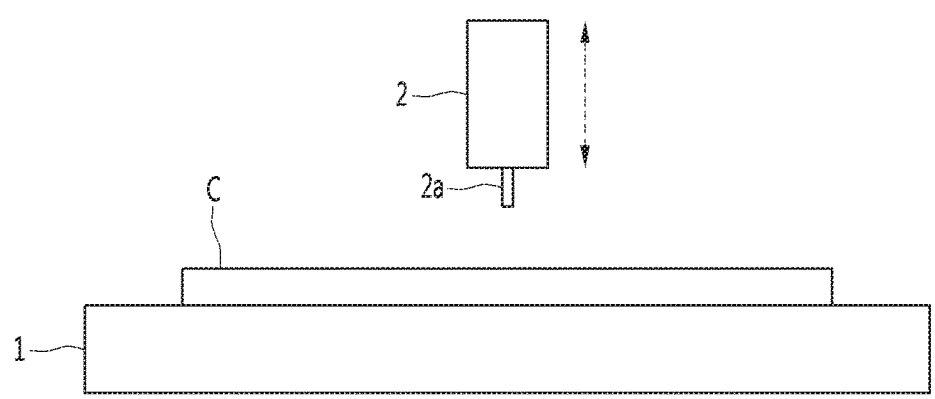
FIG. 2 is a view illustrating a wafer carrier thickness measuring device according to the related art.
Figure 3:
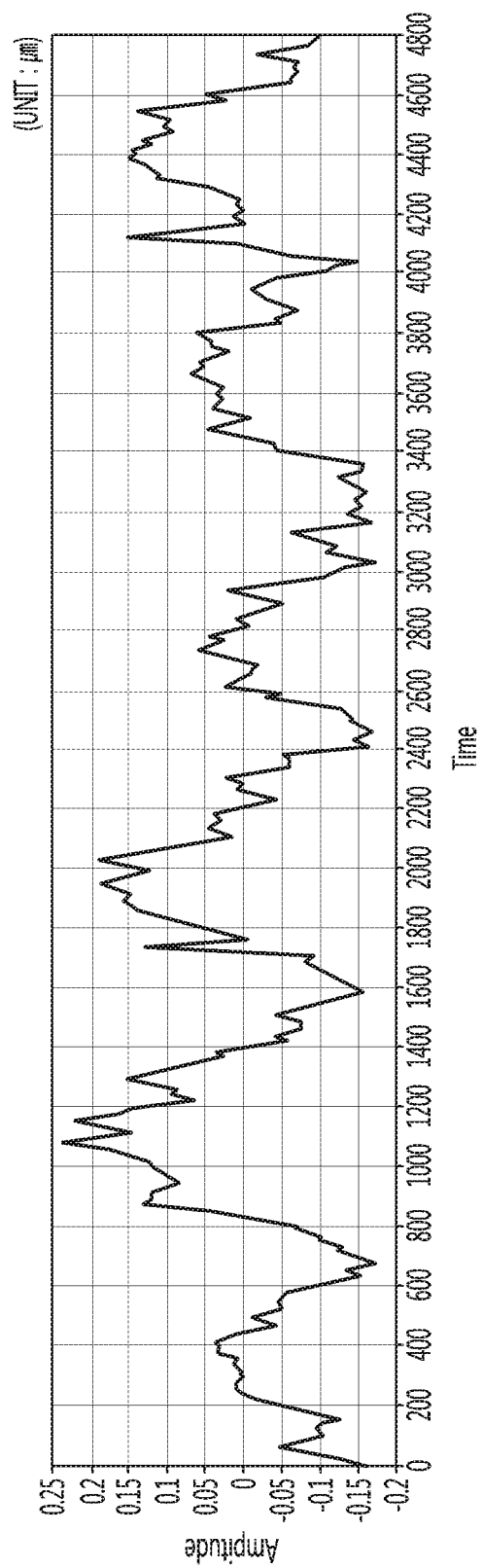
FIG. 3 is a graph illustrating a result of a thickness measurement of a wafer carrier according to the related art.
Figure 4:
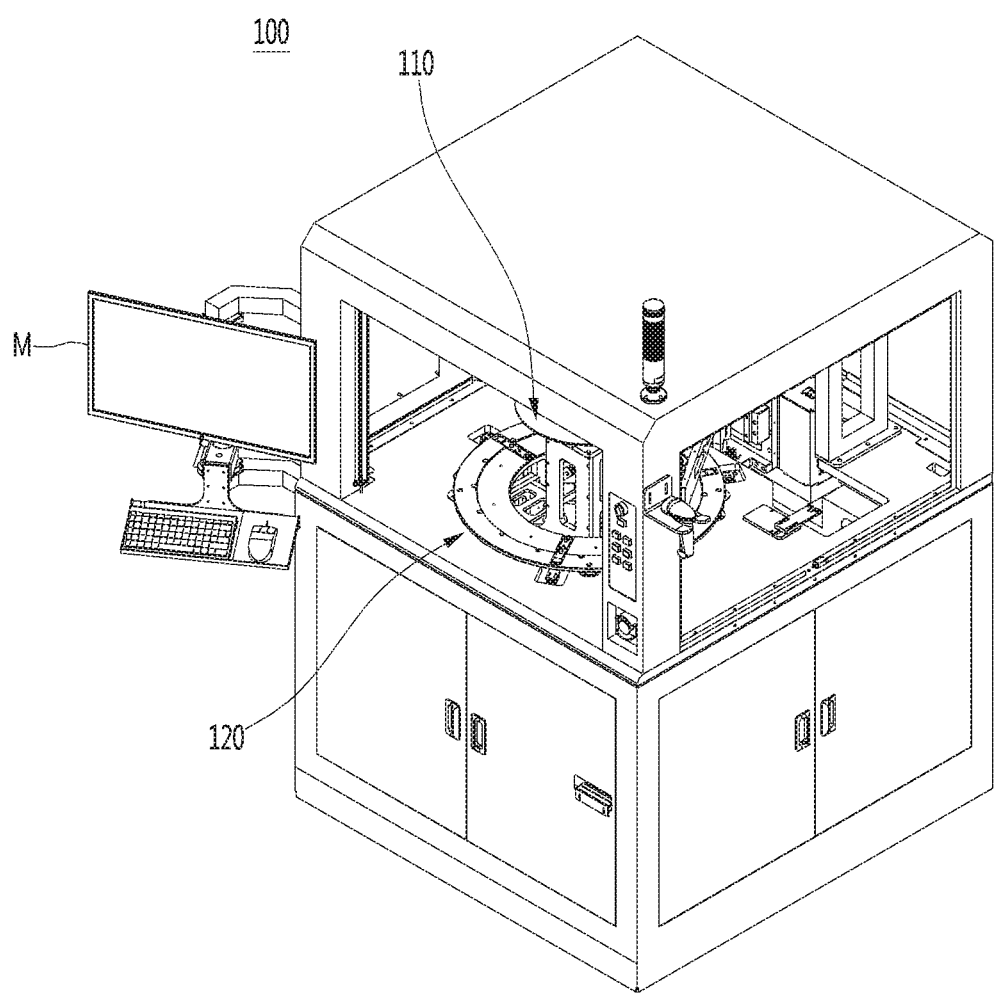
FIG. 4 is a perspective view illustrating a wafer carrier thickness measuring device of the present invention.
Figure 5:
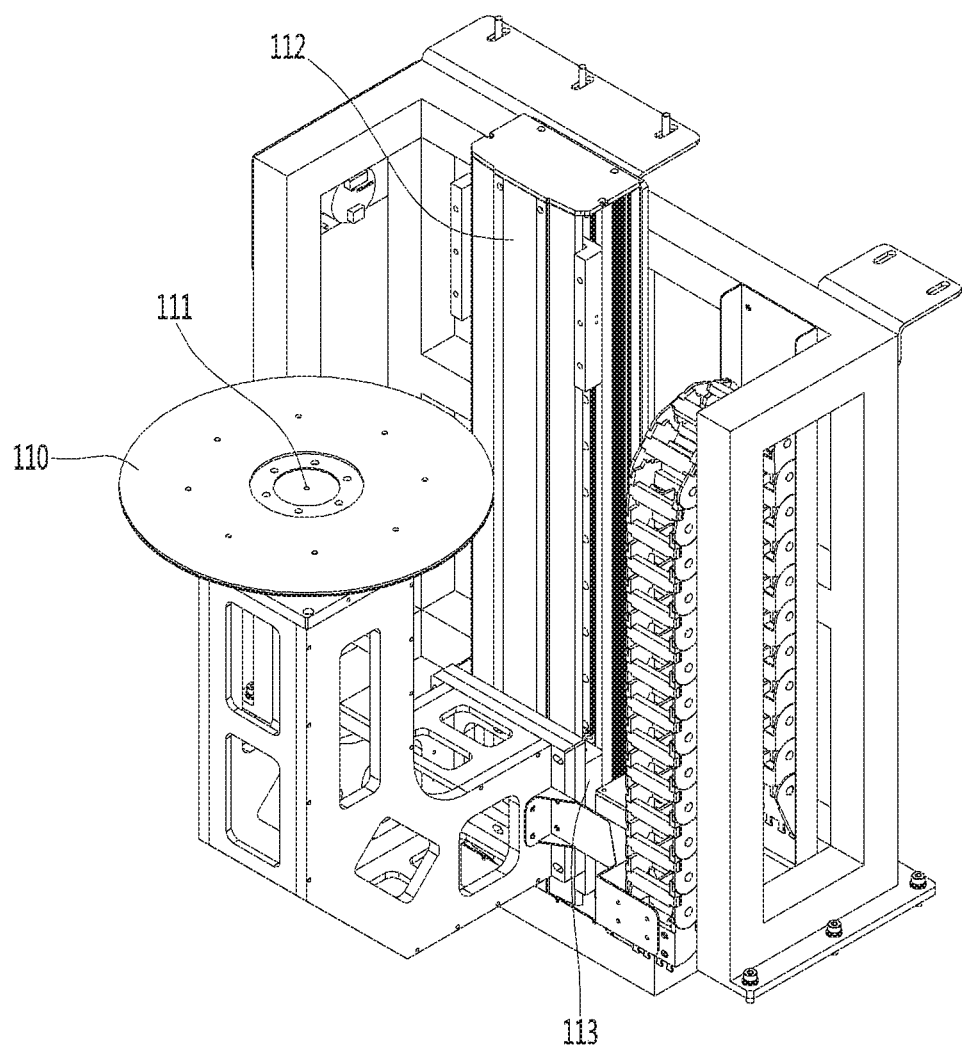
FIG. 5 is a detailed view of a first table applied to FIG. 4.

The first table 110 is configured to support an inner circumferential portion of the wafer carrier as shown in FIG. 5, and the first table 110 is configured in a disk shape whose diameter is smaller than that of the wafer carrier.

Further, the first table 110 is rotatably installed and movable vertically at the same time.

In an embodiment, the first table 110 is provided with a rotation axis 111 at a lower surface center of the first table 110, and the first table 110 may be rotated as the rotation axis 111 is rotated by a separate rotary motor (not shown).

In an embodiment, a guide rail 112 is vertically provided long on one side of the first table 110 and a guide 113 is provided on one side of a frame provided below the first table 110, and the first table 110 may be movable vertically as the guide 113 reciprocates linearly along the guide rail 112 by a separate elevating motor (not shown), but is not limited thereto.

Figure 6:
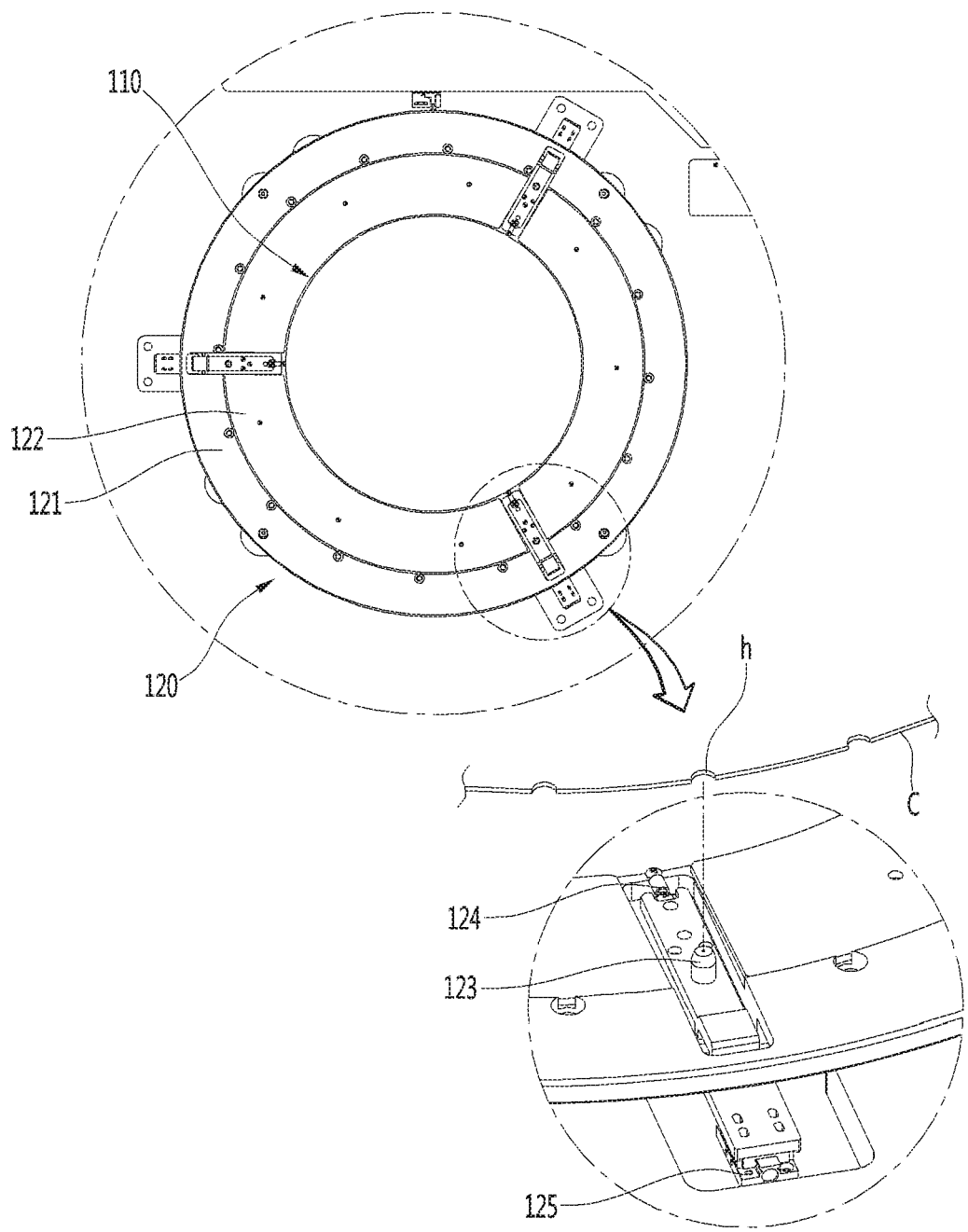
FIG. 6 is a detailed view of a second table applied to FIG. 4.

As shown in FIG. 6, the second table 120 is configured to be provided on an outer circumference of the first table 110 and to support an outer circumferential portion of the wafer carrier, and the second table 120 is configured with a ring-plate-shaped slider 121 whose inner diameter is smaller than a diameter of the wafer carrier and whose outer diameter is larger than the diameter of the wafer carrier.

Further, although the second table 120 is rotatably installed, the second table 120 is located on a reference surface and is not movable vertically separately.

In an embodiment, gear teeth are formed on an outer circumferential end of the slider 121, and a driving motor (not shown) is provided on a lower portion of one side of the slider 121. The second table 120 may be rotated as the gear teeth of the slider 121 and gear teeth rotated by the driving motor (not shown) are engaged and rotated, but is not limited thereto.

Further, since a contact portion is limited even when the wafer carrier is placed on the slider 121, the slider 121 may be provided with a pad 122 for increasing frictional force at a portion contacting the wafer carrier.

In an embodiment, the slider 121 may be provided with a ring-plate-shaped groove (not shown) as an inner circumferential portion thereof is stepped, and the pad 122 may be formed of a urethane material in a ring-plate shape and be adhered or bolt-fastened to the groove of the slider 121, but is not limited thereto.

Further, even when the wafer carrier comes into contact with the pad 122, there is a limit in frictional force, and the wafer carrier may be removed during rotation of the slider 121, and thus a positioning pin 123 may be further provided to fix a position of the wafer carrier.

In an embodiment, three of the positioning pins 123 are provided on a circumference of the second table 120 smaller than the diameter of the wafer carrier at regular intervals. The positioning pin 123 may be provided on a separate bracket provided between the slider 121 and the pad 122, and be installed to be movable in a radial direction so as to be engaged with a part of grooves h formed at regular intervals on an outer circumference of a wafer carrier C, but is not limited thereto.

In detail, the bracket may be elastically supported by a spring 124 provided in a center direction of the second table 120, and the bracket may be installed to be movable in an outer circumferential direction by a Linear Motion (LM) guide provided at a lower side and a cylinder 125 provided at an outer circumferential side, but is not limited thereto.

Figure 7:
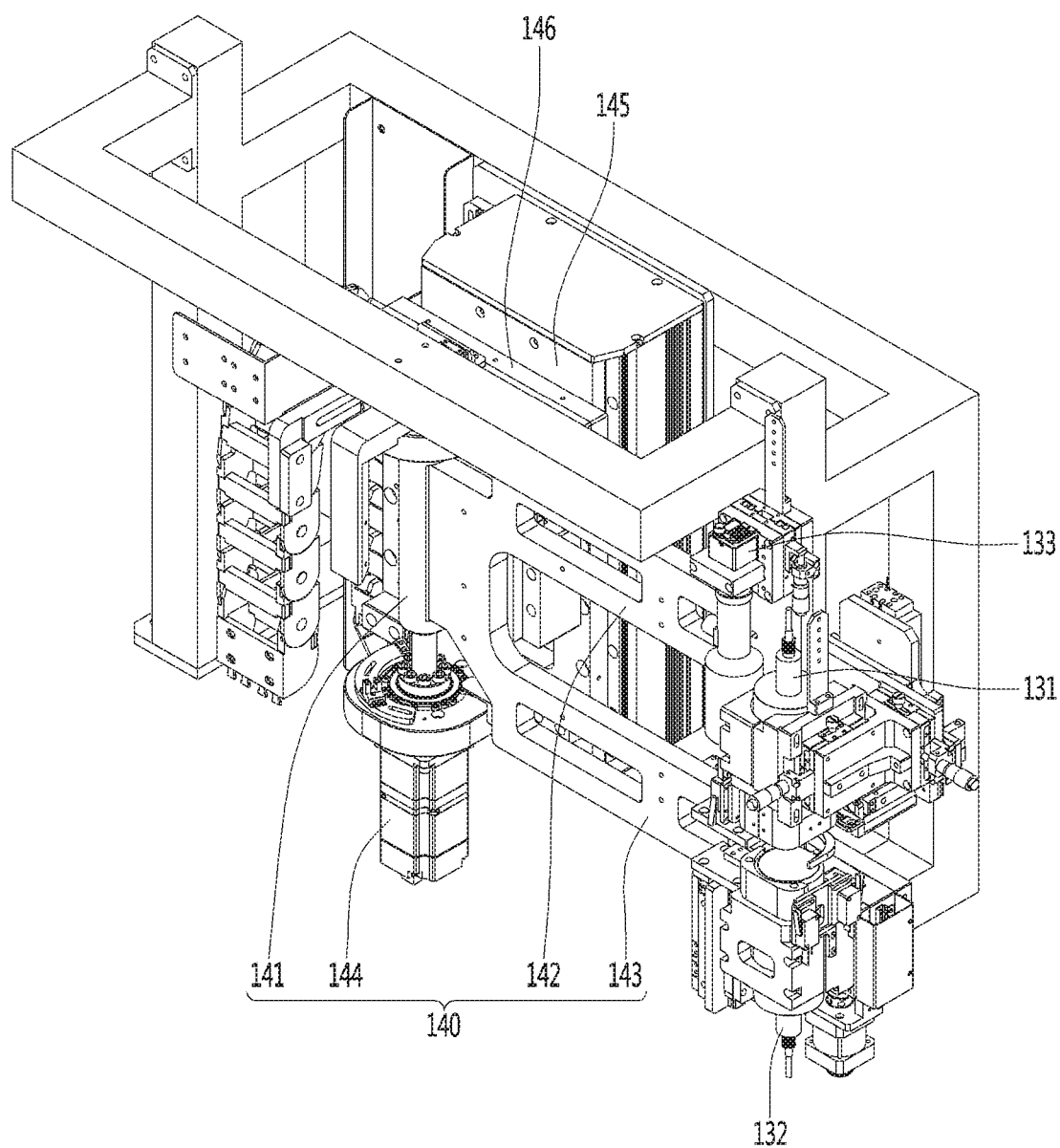
FIG. 7 is a detailed view of upper and lower sensors and a sensor driving unit applied to FIG. 4.

The upper and lower sensors 131 and 132 are positioned above and below the first and second tables 110 and 120 by the sensor driving unit 140 as shown in FIG. 7. The upper sensor 131 measures a distance to an upper surface of the wafer carrier in a non-contact manner, and the lower sensor 132 measures a distance to a lower surface of the wafer carrier in a non-contact manner.

In an embodiment, the upper and lower sensors 131 and 132 are configured with a chromatic confocal sensor, which is a kind of non-contact displacement sensor. Such a chromatic confocal sensor disperses a light source in color and converts an array into distance depending on a wavelength of the color, and thus a distance can be accurately measured even if the wafer carrier is made of an opaque or translucent material.

The sensor driving unit 140 is configured to mount the upper and lower sensors 131 and 132 and to move the first and second tables 110 and 120 vertically, wherein upper and lower fixing ends 142 and 143 is integrally provided on a rotating shaft 141 and a rotary motor 144 for rotating the rotating shaft 141 is included.

In detail, the rotating shaft 141 is vertically positioned on one side of the second table 120, wherein the upper and lower fixing ends 142 and 143 are integrally formed in a cantilever shape extending horizontally from upper and lower portions of the rotating shaft 141, and the upper and lower sensors 131 and 132 are fixed to end portions of the upper and lower fixing ends 142 and 143.

Of course, as the rotating shaft 141 rotates, the upper and lower fixing ends 142 and 143 may be positioned above and below the first and second tables 110 and 120, but the upper and lower fixing ends 142 and 143 are not interfered with the first and second tables 110 and 120 in structure.

In addition, even if the first table 110 is movable vertically, the sensor driving unit 140 is installed such that the upper and lower fixing ends 142 and 143 may be positioned above and below the first table 110.

In an embodiment, a guide rail 145 is vertically provided long on one side of the rotating shaft 141, a guide 146 movable along the guide rail 145 is connected to the rotating shaft 141, and the elevating motor (not shown) may be further provided to move the guide 146 vertically along the guide rail 145, but is not limited thereto.

Of course, the guide 146 rotatably supports the rotating shaft 141, and the upper and lower fixing ends 142 and 143 and the upper and lower sensors 131 and 132 are moved vertically together as the guide 146 is moved vertically.

In general, the wafer carrier is provided with a largest mounting hole in which the wafer is mounted in an eccentric position, and a plurality of holes are provided around the mounting hole so that a slurry supplied in a polishing process may be accommodated therein.

A thickness may be measured at the same position of the wafer carrier when a thickness of the wafer carrier in such a shape is measured, and when the wafer carrier is loaded on the first and second tables 110 and 120, a position of the wafer carrier should be aligned.

In an embodiment, the wafer carrier is provided with a separate alignment indication portion (not shown) at a specific location, which may be configured in various ways, such as a hole, a groove, or a marking indication provided on a particular outer circumferential portion of the wafer carrier, but is not limited thereto.

An alignment sensor 133 for detecting a position of an alignment indication portion on the wafer carrier is provided on the upper fixing end 142. The alignment sensor 133 may be configured with a CCD camera or the like for detecting the alignment indication portion as an image, and is not limited thereto.

Accordingly, when the wafer carrier is loaded into one of the first and second tables 110 and 120, and when the wafer carrier is rotated and the alignment sensor 133 detects an alignment indication portion of the wafer carrier, the rotation of the wafer carrier may be stopped, and distances to an upper surface and a lower surface of the wafer carrier may be measured at each point where the wafer carrier is rotated at a certain angle.

Accordingly, the present invention allows the wafer carrier to be loaded at the same position each time, and thus, a thickness may be measured at the same position for each wafer carrier, thereby increasing measurement reproducibility.

Figure 8:
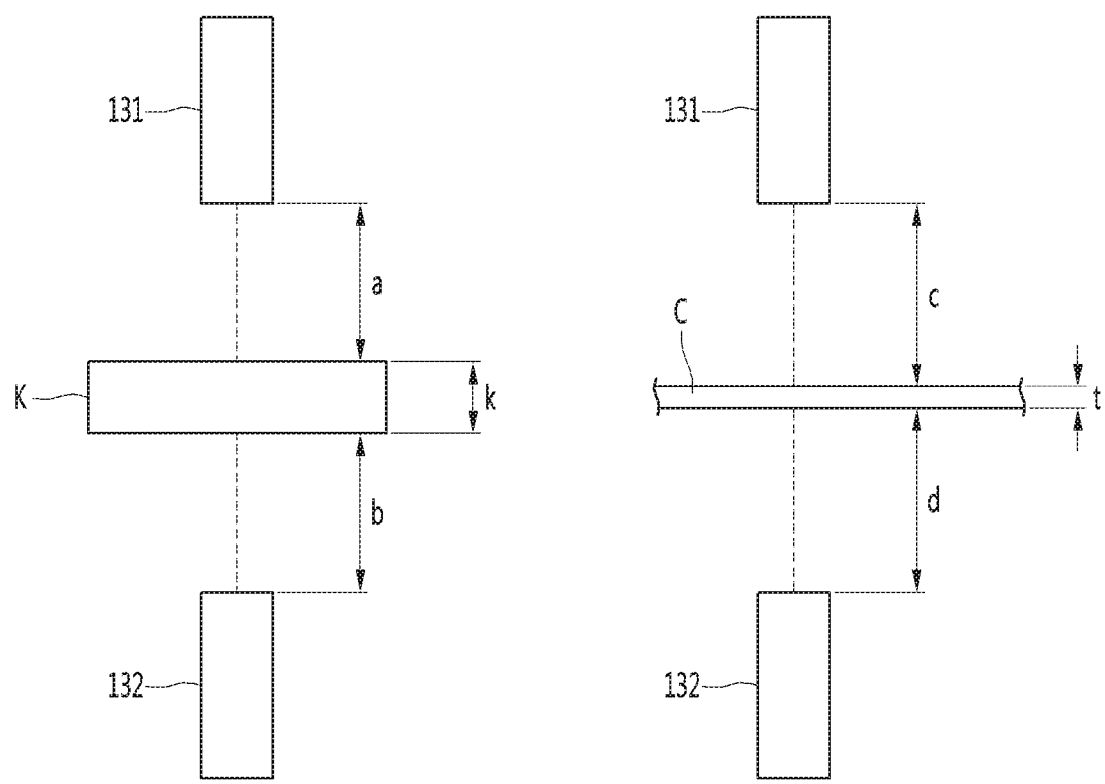
FIG. 8 is a schematic diagram illustrating principles of thickness measurement of a wafer carrier according to the present invention.

FIG. 8 is a schematic diagram illustrating principles of thickness measurement of a wafer carrier according to the present invention.

According to the present invention, as shown in FIG. 8, a standard specimen K having a known thickness k is loaded in advance, and the upper and lower sensors 131 and 132 measure distances a and b to upper and lower surfaces of the standard specimen K, and then the wafer carrier C is loaded, and the upper and lower sensors 131 and 132 measure distances c and d to upper and lower surfaces of the wafer carrier C.

Then, a computation unit (not shown) embedded in the upper and lower sensors 131 and 132 calculates a thickness t of the wafer carrier according to the following Equation 1.

$$t = k + a + b - c - d \qquad \text{[Equation 1]}$$

Of course, a part of the wafer carrier C is supported by one of the first and second tables as described above, and a thickness is measured at other points of the wafer carrier C that are not supported by the first and second tables.

FIGS. 9a to 9i are views illustrating a process of measuring a thickness of a wafer carrier according to the present invention.

Figure 9A:
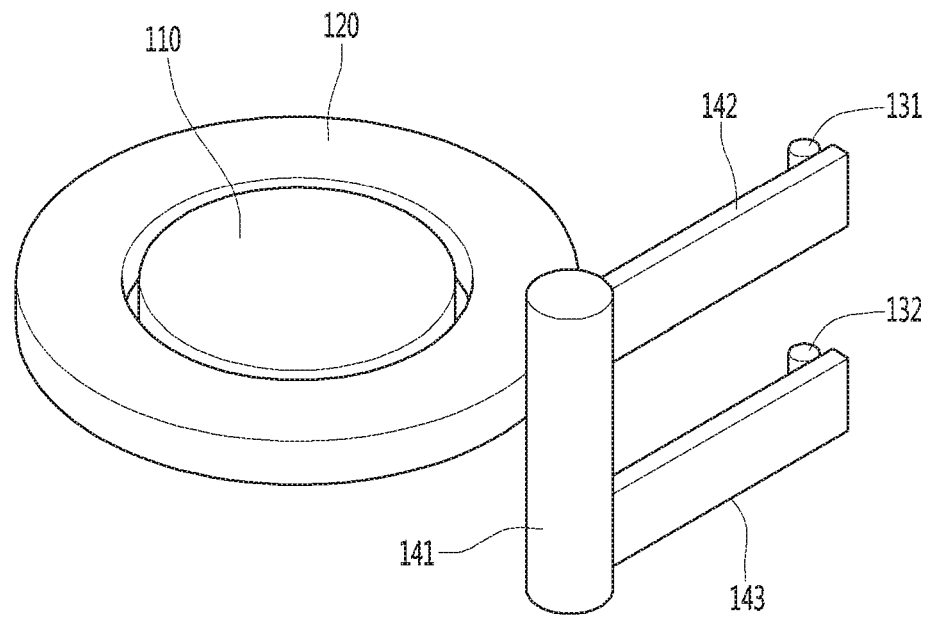
FIGS. 9a to 9i illustrate a wafer carrier thickness measuring process according to the present invention.

Looking at the carrier thickness measurement process according to the present invention, as shown in FIG. 9a, the first and second tables 110 and 120 are positioned on the same reference surface, and the upper and lower sensors 131 and 132 are positioned on one side thereof at the same time.

Figure 9B:
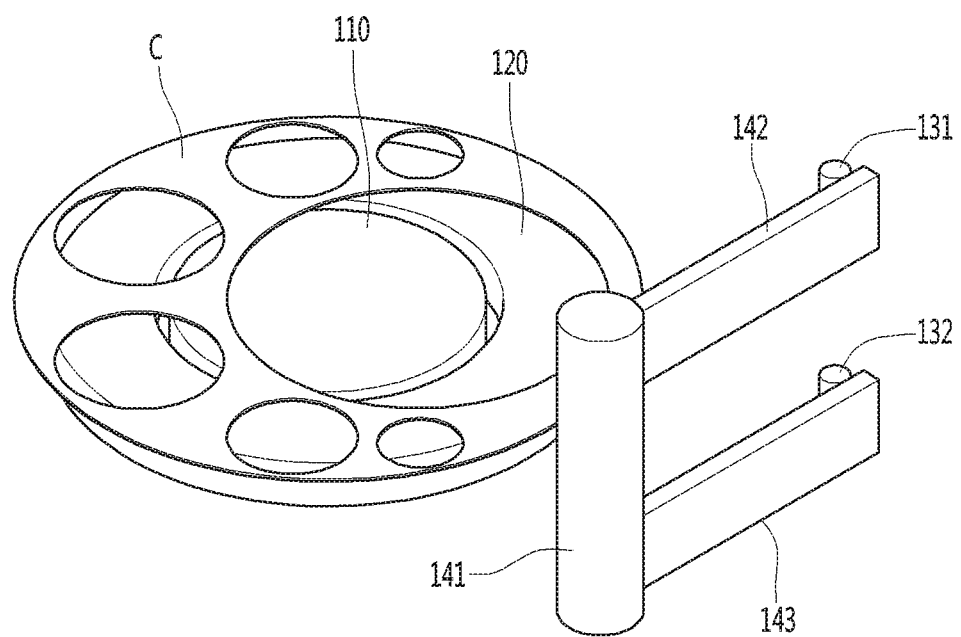

Then, as shown in FIG. 9b, when the wafer carrier C is loaded on the first and second tables 110 and 120, a position of the wafer carrier C is aligned through the alignment process as described above.

Figure 9C:
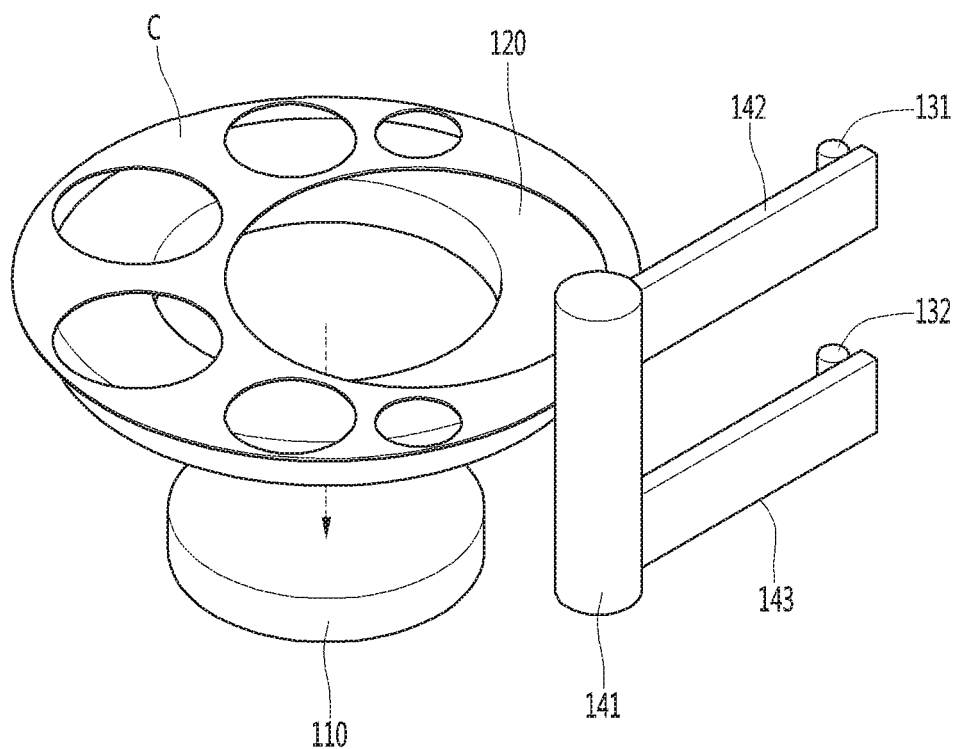

Then, as shown in FIG. 9c, when the first table 110 is lowered from the second table 120, an outer circumferential portion of the wafer carrier C is supported by the second table 120.

Figure 9D:
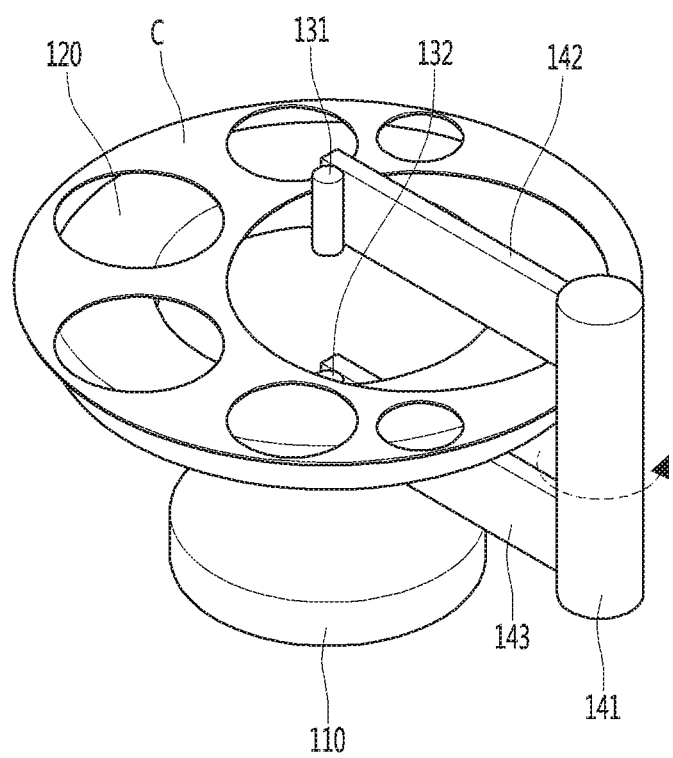

Then, as shown in FIG. 9d, when the rotating shaft 141 is rotated in a counterclockwise direction, the upper and lower fixing ends 142 and 143 are positioned above and below the second table 120, and the upper and lower sensors 131 and 132 are positioned above and below an inner circumferential portion of the wafer carrier C.

Figure 9E:
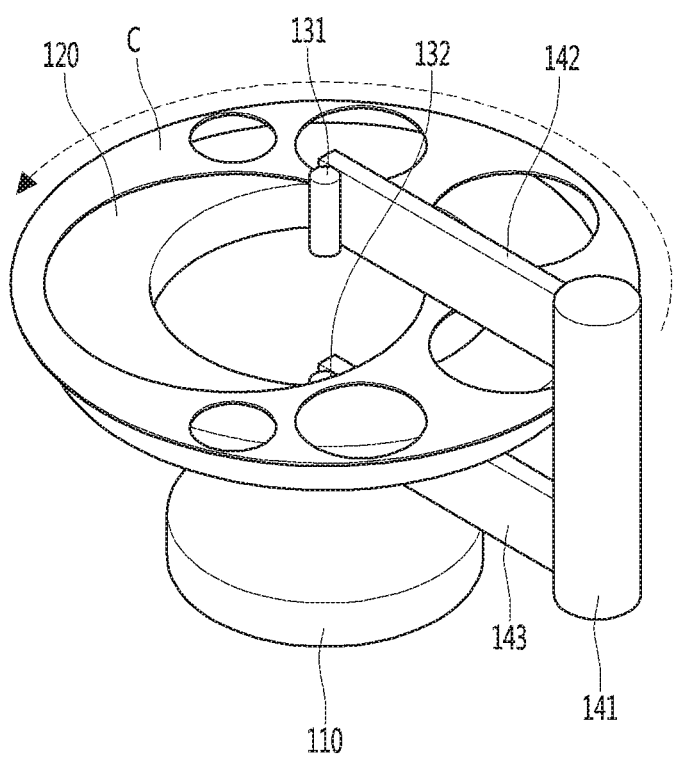

Then, as shown in FIG. 9e, the second table 120 is rotated at a predetermined angle, and the upper and lower sensors 131 and 132 measure a thickness of the wafer carrier C for each position of the inner circumferential portion of the wafer carrier C whenever the second table 120 is rotated.

Figure 9F:
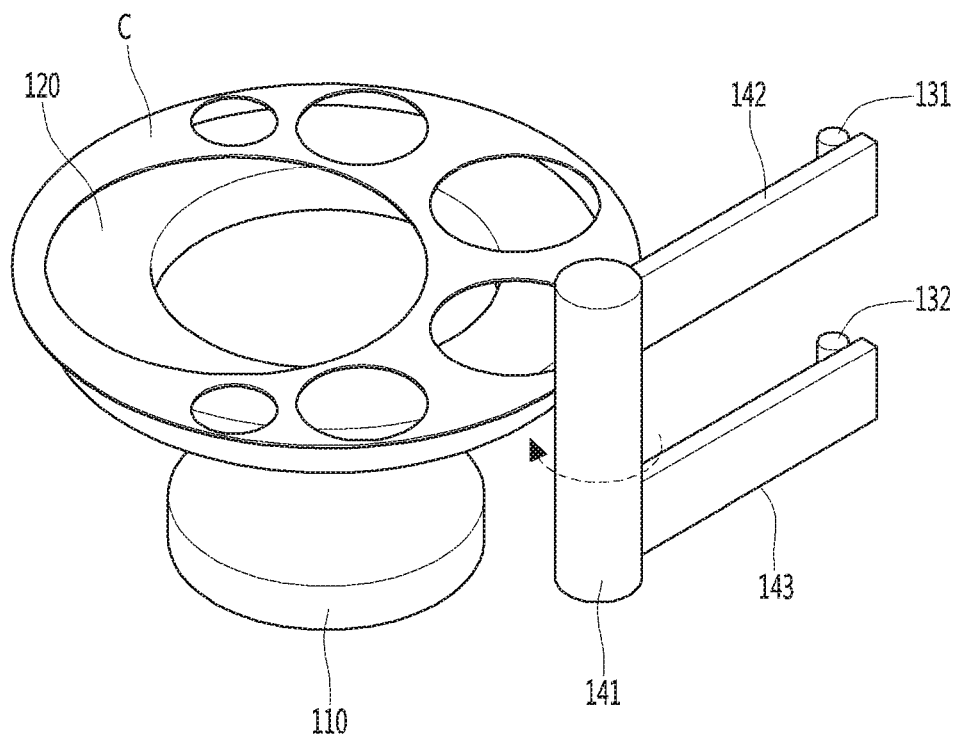

Accordingly, a thickness measurement is completed for each position of the inner circumferential portion of the wafer carrier C, and then, as shown in FIG. 9f, when the rotating shaft 141 is rotated in a clockwise direction, the upper and lower fixing ends 142 and 143 and the upper and lower sensors 131 and 132 are moved to a position where the upper and lower fixing ends 142 and 143 and the upper and lower sensors 131 and 132 are not interfered with one side of the first and second tables 110 and 120.

Figure 9G:
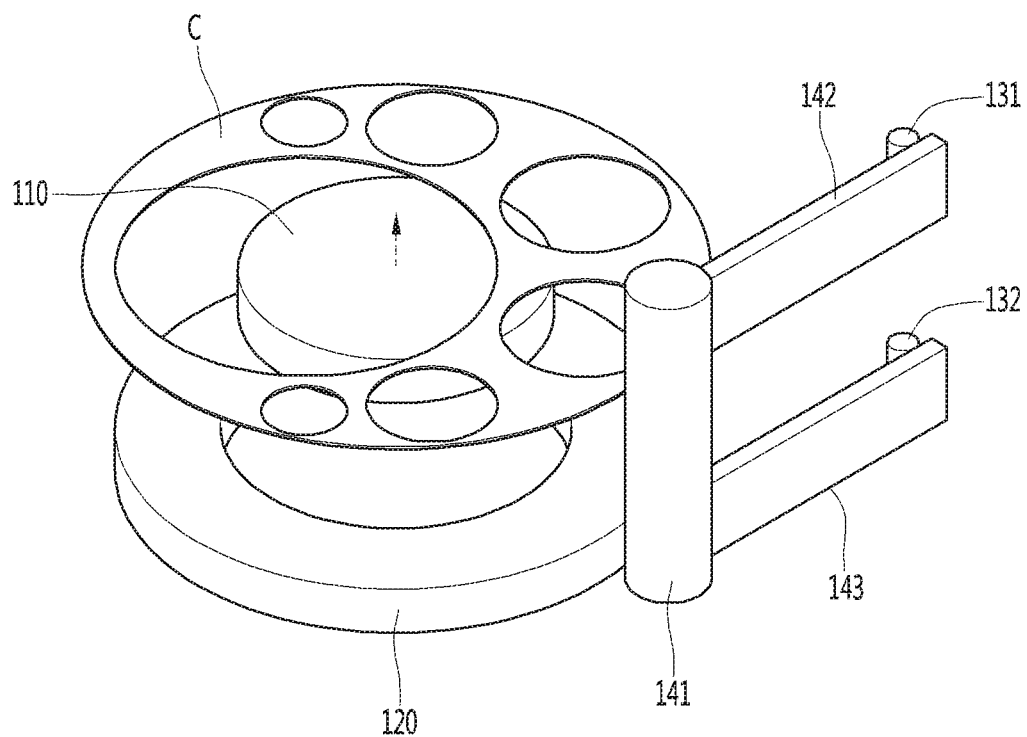

Then, as shown in FIG. 9g, when the first table 110 is elevated above the second table 120, the inner circumferential portion of the wafer carrier C is supported by the first table 110, and the rotating shaft 141 also is elevated by an elevated height of the first table 110 that is higher than the second table 120.

Figure 9H:
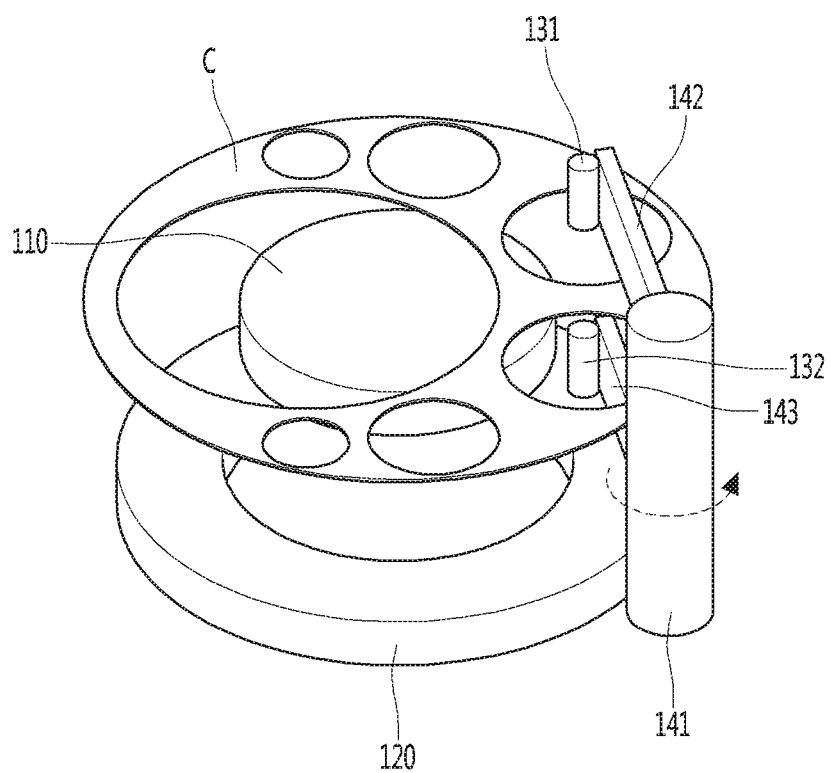

Then, as shown in FIG. 9h, when the rotating shaft 141 is rotated in a counterclockwise direction, the upper and lower fixing ends 142 and 143 are positioned above and below the first table 110, and the upper and lower sensors 131 and 132 are positioned above and below the outer circumferential portion of the wafer carrier C.

Figure 9I:
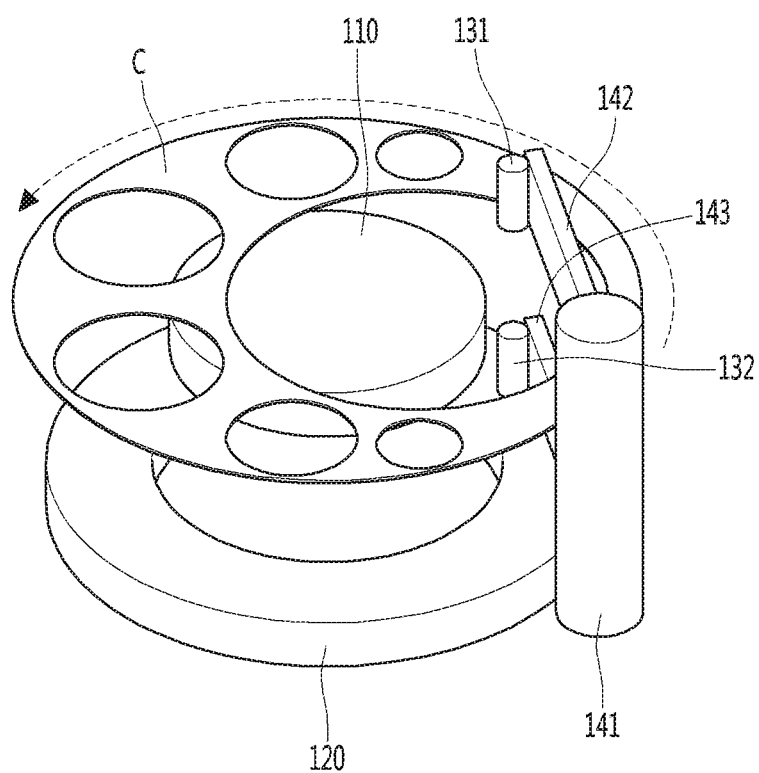

Then, as shown in FIG. 9i, the first table 110 is rotated at a predetermined angle, and the upper and lower sensors 131 and 132 measure a thickness of the wafer carrier C for each position of the outer circumferential portion of the wafer carrier C whenever the first table 110 is rotated.

As described above, according to the present invention, since a thickness is measured in a non-contact manner at a point where a wafer carrier is not supported and a part of the carrier is supported at the same time, damage of the wafer carrier may be prevented and a thickness of the wafer carrier may be accurately measured, thereby improving measurement accuracy.

INDUSTRIAL APPLICABILITY

A wafer carrier thickness measuring device of the present invention may accurately measure inner and outer circumferential thicknesses of a wafer carrier in a non-contact manner.

The invention claimed is:

1. A wafer carrier thickness measuring device, comprising:
   a first table installed to be capable of rotating and moving vertically and capable of supporting a central portion of a wafer carrier;
   a second table disposed outside the first table and rotatably installed, and capable of supporting an outer circumferential portion of the wafer carrier;
   upper and lower sensors for calculating a thickness of the wafer carrier by measuring a distance to upper and lower surfaces of the wafer carrier supported by one of the first and second tables in a non-contact manner; and
   a sensor driving unit located at one side of the second table and moving the upper and lower sensors to an upper side or a lower side of the wafer carrier supported by one of the first and second tables.

2. The wafer carrier thickness measuring device of claim 1, wherein the second table is configured in a ring-plate shape having an inner diameter smaller than a diameter of the wafer carrier and an outer diameter larger than the diameter of the wafer carrier.

3. The wafer carrier thickness measuring device of claim 2, wherein the second table is configured with a slider in which gear teeth formed at an outer circumferential end thereof are rotated in engagement with gear teeth rotated by a driving motor.

4. The wafer carrier thickness measuring device of claim 1, wherein the second table is further provided with a pad capable of increasing frictional force at a portion contacting the wafer carrier.

5. The wafer carrier thickness measuring device of claim 4, wherein the pad is in a ring plate shape of a urethane material that is seated on an inner circumferential end of the second table.

6. The wafer carrier thickness measuring device of claim 1, wherein the second table is further provided with at least two or more positioning pins that may engage with grooves formed on an outer circumference of the wafer carrier.

7. The wafer carrier thickness measuring device of claim 6, wherein the positioning pin is elastically supported in a center direction of the second table.

8. The wafer carrier thickness measuring device of claim 1, wherein the positioning pin is connected to a cylinder capable of moving in an outer circumferential direction of the second table.

9. The wafer carrier thickness measuring device of claim 1, wherein the upper and lower sensors are configured with a chromatic confocal sensor.

10. The wafer carrier thickness measuring device of claim 9, wherein the upper and lower sensors include an computation unit for calculating a thickness t of the wafer carrier in consideration of a thickness k of a standard specimen and measured distances a and b to upper and lower surfaces of the standard specimen, and measured distances c and d to the upper and lower surfaces of the wafer carrier.

11. The wafer carrier thickness measuring device of claim 1, wherein the sensor driving unit includes a rotating shaft positioned on one side of the second table in a vertical direction, an upper fixing end extending in a horizontal direction from an upper portion of the rotating shaft and fixing the upper sensor, a lower fixing end extending in a horizontal direction from a lower portion of the rotating shaft and fixing the lower sensor, and a rotary motor for rotating the rotating shaft.

12. The wafer carrier thickness measuring device of claim 11, wherein the sensor driving unit includes a guide rail extending vertically long on one side of the rotating shaft, a guide moving along the guide rail and rotatably supporting the rotating shaft, and an elevating motor moving vertically the guide along the guide rail.

13. The wafer carrier thickness measuring device of claim 1, wherein the wafer is provided with at least one or more alignment indication portions, and the wafer carrier thickness measuring device further comprises an alignment sensor for detecting the alignment indication portion of the wafer placed on one of the first and second tables.

14. The wafer carrier thickness measuring device of claim 13, wherein the alignment indication portion is provided in a shape of a hole in the outer circumferential portion of the wafer, and the alignment sensor is configured with a camera for detecting the alignment indication portion as an image.

* * * * *